(12) United States Patent
Wang

(10) Patent No.: US 8,580,661 B1
(45) Date of Patent: Nov. 12, 2013

(54) METHOD FOR THE HYDROGENATION OF POLY-SI

(75) Inventor: Qi Wang, Littleton, CO (US)

(73) Assignee: U.S. Department of Energy, Washington, DC (US)

(*) Notice: Subject to any disclaimer, the term of this patent is extended or adjusted under 35 U.S.C. 154(b) by 112 days.

(21) Appl. No.: 13/216,304

(22) Filed: Aug. 24, 2011

(51) Int. Cl.
H01L 21/20 (2006.01)

(52) U.S. Cl.
USPC .................. 438/488; 257/E21.412

(58) Field of Classification Search
USPC .................. 438/488, 490; 257/E21.412
See application file for complete search history.

(56) References Cited

U.S. PATENT DOCUMENTS

| 6,057,182 A * | 5/2000 | Goodman et al. ......... 438/162 |
| 7,026,226 B1 * | 4/2006 | Lin ......................... 438/474 |
| 2002/0132411 A1 * | 9/2002 | Meiling et al. ............. 438/205 |
| 2004/0106269 A1 * | 6/2004 | Deng et al. ................ 438/479 |
| 2009/0004100 A1 * | 1/2009 | Umemoto et al. ......... 423/648.1 |

* cited by examiner

Primary Examiner — William D Coleman
Assistant Examiner — Christine Enad
(74) Attorney, Agent, or Firm — Michael J. Dobbs; Daniel D. Park; John T. Lucas

(57) ABSTRACT

A method for hydrogenating poly-si. Poly-si is placed into the interior of a chamber. A filament is placed into the interior of a chamber. The base pressure of the interior of the chamber is evacuated, preferably to $10^{-6}$ Torr or less. The poly-si is heated for a predetermined poly-si heating time. The filament is heated by providing an electrical power to the filament. Hydrogen is supplied into the pressurized interior of the chamber comprising the heated poly-si and the heated filament. Atomic hydrogen is produced by the filament at a rate whereby the atomic hydrogen surface density at the poly-si is less than the poly-si surface density. Preferably, the poly-si is covered from the atomic hydrogen produced by the heated filament for a first predetermined covering time. Preferably, the poly-si is then uncovered from the atomic hydrogen produced by the heated filament for a first hydrogenation time.

21 Claims, 6 Drawing Sheets

US 8,580,661 B1

METHOD FOR THE HYDROGENATION OF POLY-SI

CROSS-REFERENCE TO RELATED APPLICATIONS

GOVERNMENT INTERESTS

The United States Government has rights in this invention under Contract No. DE-AC36-08GO28308 between the United States Department of Energy and the Alliance for Sustainable Energy, LLC, the manager and operator of the National Renewable Energy Laboratory.

FIELD OF THE INVENTION

The present invention relates to the hydrogenation of poly-si, preferably for use in photovoltaics.

BACKGROUND OF THE INVENTION

Poly-si is a key component for integrated circuits and photovoltaics. Poly-si has long been used as the conducting gate material in MOSFET and CMOS processing technologies, etc. Poly-si is generally formed on a poly-si by pyrolyzing silane ($SiH_4$) at 580 to 650° C. Generally, poly-si layers are deposited using 100% silane or 20-30% silane (diluted in nitrogen) both at a pressure of 25-130 Pa (0.2 to 1.0 Torr). However, other deposition techniques are also used, for example, low-pressure chemical-vapor deposition (LPCVD). Sadly, poly-si photovoltaics, although low cost, do not currently provide acceptable efficiencies for large-scale use.

SUMMARY OF THE INVENTION

A method for hydrogenating poly-si. Poly-si is placed into the interior of a chamber. A filament is placed into the interior of a chamber. The base pressure of the interior of the chamber is evacuated, preferably to $10^{-6}$ Torr or less. The poly-si is heated for a predetermined poly-si heating time. The filament is heated by providing an electrical power to the filament. Hydrogen is supplied into the pressurized interior of the chamber comprising the heated poly-si and the heated filament. Atomic hydrogen is produced by the filament at a rate whereby the atomic hydrogen surface density at the poly-si is less than the poly-si surface density. Preferably, the poly-si is covered from the atomic hydrogen produced by the heated filament for a first predetermined covering time. Preferably, the poly-si is then uncovered from the atomic hydrogen produced by the heated filament for a first hydrogenation time.

DETAILED DESCRIPTION OF THE INVENTION

Figure 1:
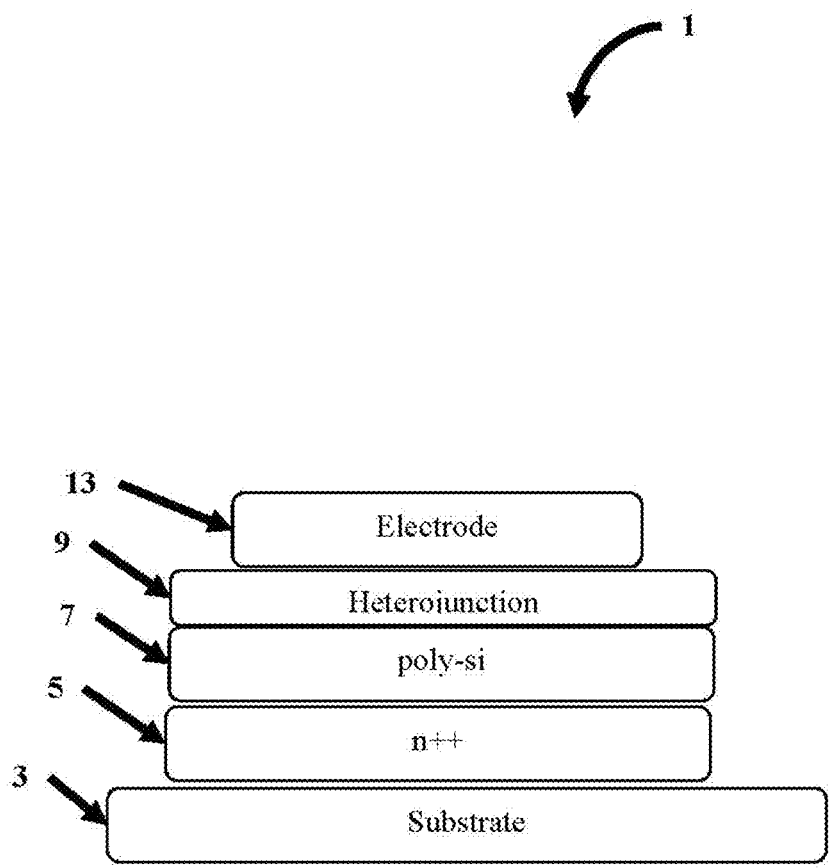
FIG. 1 depicts a preferred embodiment of a complete hydrogenated poly-si photovoltaic cell.

A method for hydrogenating poly-si. Poly-si is placed into the interior of a chamber. A filament is placed into the interior of the chamber. The base pressure of the interior of the chamber is evacuated, preferably to $10^{-6}$ Torr or less. The poly-si is heated for a predetermined poly-si heating time. The filament is heated by providing electrical power to the filament. Hydrogen is supplied into the evacuated interior of the chamber comprising the heated poly-si and the heated filament. Atomic hydrogen is produced by the filament at a rate whereby the atomic hydrogen surface density at the poly-si is less than the poly-si surface density. Preferably, the poly-si is covered from the atomic hydrogen produced by the heated filament for a first predetermined covering time. Preferably, the poly-si is then uncovered from the atomic hydrogen produced by the heated filament for a first hydrogenation time.

Calculating the Maximum Hydrogen Supply Rate

Preferably, the hydrogen is supplied at rate to minimize the etching of the poly-si, while also maximizing the hydrogen flow in order to reduce the time needed for hydrogenation. Atomic hydrogen is produced by the filament at a rate whereby the atomic hydrogen surface density at the poly-si is less than the poly-si surface density. In a preferred embodiment, the surface density of the poly-si (~6.77E14/$cm^2$ for 100 orientation; ~9.60E14/$cm^2$ for 110 orientation; ~7.83E14/$cm^2$ for 111 orientation) is used in calculations to determine an optimal hydrogen supply rate. Preferably, the hydrogen surface density is less than the poly-si surface density in any direction. The hydrogen per volume (n) may be calculated using the ideal gas law as follows in Eq. 1:

$$n = \frac{P}{kT} \quad \text{(Eq. 1)}$$

Where N is the hydrogen per volume, P is the absolute pressure, k is Boltzmann's constant and T is the absolute temperature. For example, if P is 40 N/$m^2$; T is 343K; k is $1.38E^{-23}$ (J/K) then the hydrogen per volume (n) is 8.45E21/$m^3$.

Once the hydrogen per volume has been determined, preferably the atomic hydrogen (H) is determined for the filament used. The total number of atomic hydrogen ($H_{Total}$) near the filament is simply as follows in Eq. 2:

$$H_{Total} = n * F_v * \text{Eff.} * 2 \quad \text{(Eq. 2)}$$

Where the $H_{Total}$ is the total number of atomic hydrogen; N is the hydrogen per volume, $F_v$ is the filament volume, Eff. Is the atomic hydrogen generation efficiency; and 2 is the number of atomic hydrogen produced when splitting $H_2$. For example, for a filament having a length of 15 cm; a diameter of 0.5 cm, and a hydrogen generation efficiency of 50% (approximate for the filament at 1,800K), the total number of atomic hydrogen would be calculated to 9.95E16. Preferably, the hydrogen generation efficiency is calculated or determined experimentally. In one embodiment, the hydrogen generation efficiency is determined using a means similar to the means described in Bornscheuer, K. H.; Lucas, S. R.;

Choyke, W. J.; Partlow, W. D.; Yates, J. T.; "Reflector atomic hydrogen source: A method for producing pure atomic hydrogen in ultrahigh vacuum," Journal of Vacuum Science & Technology A: Vacuum, Surfaces, and Films, vol. 11, no. 5, pp. 2822-2826, September 1993, hereby fully incorporated by reference.

Once the total number of atomic hydrogen has been determined, the atomic hydrogen surface density at the poly-si ($H_{poly-si}$) can be determined using the following Eq. 3:

$$H_{Poly-Si} = \frac{H_{Total}}{A_{Surface}}$$

where $H_{poly-si}$ is the atomic hydrogen surface density at the poly-si; $H_{Total}$ is the total number of atomic hydrogen, and $A_{surface}$ is the surface area of the geometric shape extending from the filament to the poly-si. Preferably, geometric shape extending from the filament to the poly-si is, or is approximated as a cylinder. For example, if the distance from the filament to the poly-si is 5 cm, the surface area of the geometric shape of the cylinder extending from the filament to the poly-si without including the top and bottom sides can be calculated (or approximated) as $2\pi rL$; where r is the radius (5 cm) and L is the length (15 cm) of the geometric shape, the atomic hydrogen surface density would be $2.11E14/cm^2$. The atomic hydrogen surface density at the poly-si ($H_{poly-si}$) is depending on filament temperature due to the changes in hydrogen generation efficiency.

Preferably, the atomic hydrogen surface density at the poly-si ($H_{poly-si}$) is optimized to be below the poly-si density at the surface (~$6.77E14/cm^2$ for 100 orientation; ~$9.60E14/cm^2$ for 110 orientation; ~$7.83E14/cm^2$ for 111 orientation). As the poly-si density at the surface for 100 orientation Si is the lowest density, preferably, the hydrogen supply rate and the poly-si temperature, including any other variables, are optimized to maintain the atomic hydrogen surface density at the poly-si ($H_{poly-si}$) below ~$6.77E14/cm^2$ (the poly-si density at the surface for 100 orientation).

Preferably, while hydrogen is supplied, the poly-si material is maintained at a temperature above 126.85° C.

FIG. 1

FIG. 1 depicts a preferred embodiment of a complete hydrogenated poly-si photovoltaic cell 1. As shown on FIG. 1, the photovoltaic cell 1 comprises the following layers in the following order: a substrate 3, n-type semiconductor 5, poly-si 7, Heterojunction 9, and a transparent electrode 13.

The substrate is any rigid body capable of maintaining the structural integrity of the photovoltaic cell 1. Preferably, the substrate 3 is glass.

The n-type semiconductor 5 is any n-type semiconductor, more preferably a $PH_3$ mixed with $SiH_4$, preferably forming a 0.5 micron layer. Preferably, the n-type semiconductor layer 5 is deposited by HWCVD (hot wire chemical vapor deposition). In a preferred embodiment, n-type semiconductor layer 5 is deposited by HWCVD is at 540° C., with a process pressure of 9 mTorr.

The poly-si 7 is any material comprising poly-si. Preferably, the poly-si 7 is formed from $SiH_4$. Preferably the poly-si 7 is deposited by HWCVD. In a preferred embodiment, the poly-si 7 is deposited by HWCVD at 550 to 710° C., with a $SiH_4$ pressure of 9 mTorr, preferably forming a 1.5 micron layer of poly-si 7. Once formed, the poly-si 7 is preferably hydrogenated. In a preferred embodiment, once formed, the poly-si 7 is hydrogenated, with a hydrogen pressure of 300 mTorr, for 90 minutes at 550° C.

The heterojunction 9 is two layers or regions of dissimilar crystalline semiconductors. In a preferred embodiment, the heterojunction 9 is a thin i-type semiconductor, preferably $SiH_4$, juxtaposed to a p-type semiconductor, preferably $SiH_4$ mixed with Trimethylboron (TMB) or other gases containing boron. Preferably, the heterojunction 9 is a 6 nm $SiH_4$ i-layer and a 12 nm $SiH_4$ mixed with TMB p-layer. In a preferred embodiment, the heterojunction 9 is a 6 nm $SiH_4$ i-layer deposited by HWCVD at 180° C. at 9 mTorr and a 12 nm $SiH_4$ mixed with TMB p-layer deposited by HWCVD at 180° C. at 65 mTorr.

The transparent electrode 13 is any transparent (allows at least some photons to pass through) electrically conductive material, preferably a transparent conducting oxide (TCO), more preferably Indium tin oxide (ITO). In other embodiments, the TCOs is aluminum-doped zinc-oxide (AZO) or indium-doped cadmium-oxide. Preferably, the electrode an 80 nm thick ITO layer, deposited by evaporation at 170° C.

FIG. 2

Figure 2:
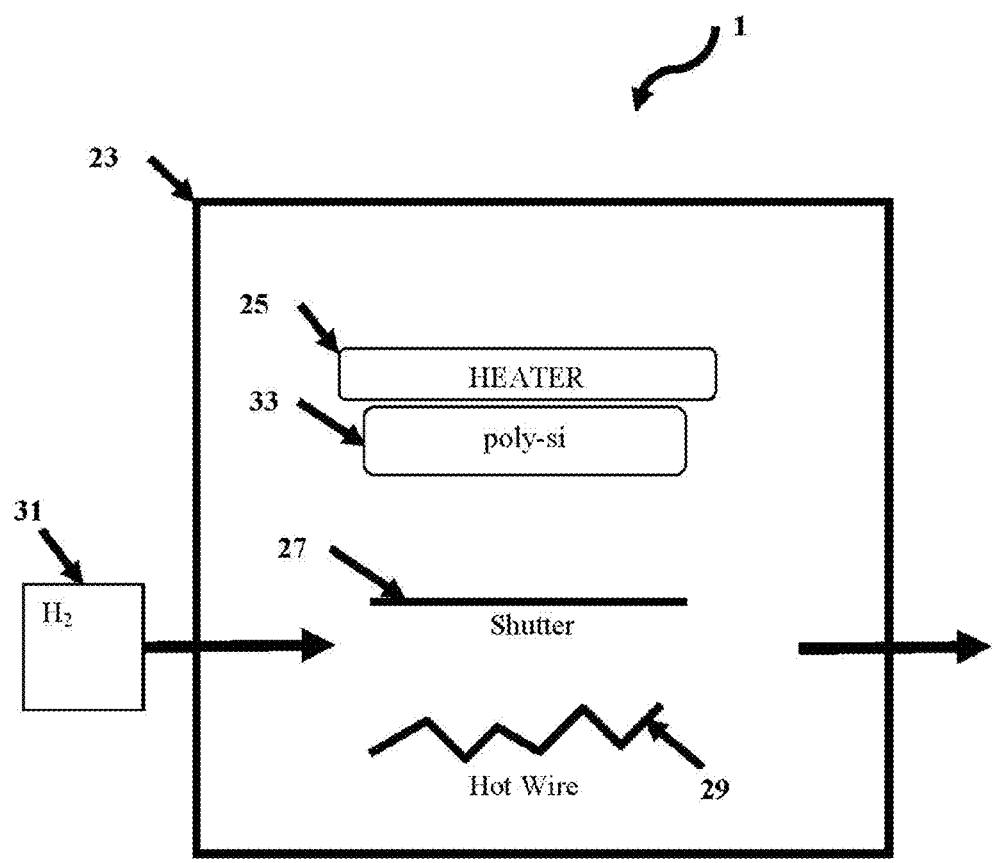
FIG. 2 depicts a preferred embodiment of a hotwire chemical vapor deposition chamber depicting poly-si hydrogenation.

FIG. 2 depicts a preferred embodiment of a hotwire chemical vapor deposition chamber 21 depicting poly-si hydrogenation. The embodiment of a hotwire chemical vapor deposition (HWCVD) chamber 21 in FIG. 2 comprises: a chamber 23, a heater 25, a shutter 27, a filament 29, and a hydrogen supply 31. The poly-si to be hydrogenated 33 is positioned in thermal contact, more preferably adjacent to, the heater 25. The shutter 27 is positioned between the filament 29 and the poly-si 33. Preferably, the hydrogen supply 31 supplies hydrogen directly across the filament 29 to avoid a deficiency of hydrogen near the filament, as the filament 29 will consume hydrogen to produce atomic hydrogen.

The chamber 23 is preferably made from stainless steel or quartz tube. The chamber 23 has ports for gas inlet, vacuum pumping, filament electrodes, and mounting the shutter. Preferably, the base pressure of the interior of the chamber 23 is $10^{-6}$ Torr or less. Preferably, one or more vacuums (not shown for simplicity) extract fluid out of the interior of the chamber 23, preferably using one or more pumps.

The heater 25 is anything capable of heating the poly-si 33. Preferably, the heater 25 is a ceramic heater, however other heaters may also be used, for example lasers, furnaces, radioactive sources etc. Preferably, the poly-si 33 is heated at least above 126.85° C. In a preferred embodiment, the poly-si is heated between, and including, 300 and 600° C., more preferably between, and including, 550 and 600° C. Preferably, the filament 29 is 15 cm long, and positioned 5 cm from the poly-si 33. Preferably, the poly-si 33 is heated for a predetermined poly-si heating time before hydrogenation begins. The predetermined poly-si heating time is the time necessary to heat the poly-si 33 in FIG. 2, to the desired temperature, preferably from 300 to 600° C., more preferably approximately 550° C. The predetermined poly-si heating time is preferably optimized, thereby minimizing the time, while also accounting for poly-si size, material, heater size, temperature, thermal conductivity etc.

The hydrogen supply 31 is preferably a hydrogen tank, or hydrogen source (e.g. electrolysis of water) with any necessary pumps, valves, etc. Preferably, the supply source supplies hydrogen at a pressure between 100-500 mTorr.

The shutter 27 is preferably made from stainless steel or quartz plate and mounted on a linear positioner through a vacuum port. The shutter 27 is closed, thereby not allowing atomic hydrogen produce by the filament 29 to pass to the poly-si 33 for a first predetermined covering time. Preferably, the first predetermined covering time is optimized to minimize unnecessary exposure to the heating of the poly-si 33 by the filament 29, while the filament 29 is heated to its desired temperature. In one embodiment, the first predetermined covering time is 30 minutes.

The filament 29 is preferably a filament made of tungsten, tantalum, graphite, or a combination thereof. In a preferred embodiment, the filament 29 is a tungsten filament with a 0.5 mm diameter and a length of 15 cm. Preferably the filament 29 is 5 cm from the poly-si 33. The filament 29 is electrically connected, preferably by one or more wires, to a power source (not shown for simplicity). Preferably, the power source provides between, and including, 6 to 18 amps of current (approximately 1,500 to 2,300° C. for a 0.5 mm diameter tungsten filament), more preferably approximately 10 amps. Preferably, to avoid damaging the poly-si 33, the filament is heated to a temperature less than 2,300° C., more preferably between 1,500 to 2,300° C.

Once the poly-si 33 material has been heated, preferably the shutter 27 is opened to allow for the atomic hydrogen produced at the heated filament 29 to pass to the poly-si 33 for a first predetermined hydrogenation time. Preferably, the first predetermined hydrogenation time is optimized to maximize the desired hydrogenation of the poly-si 33 for factors such as filament 29 temperature, poly-si 33 temperature, the hydrogen supply 31 rate (hydrogen pressure), the chamber 23 pressure etc. In a preferred embodiment, the first predetermined hydrogenation time is 30 minutes.

After said steps of heating the poly-si, heating the filament, covering the poly-si, and uncovering the poly-si, preferably the heated poly-si is cooled in hydrogen ($H_2$).

FIG. 3

Figure 3:
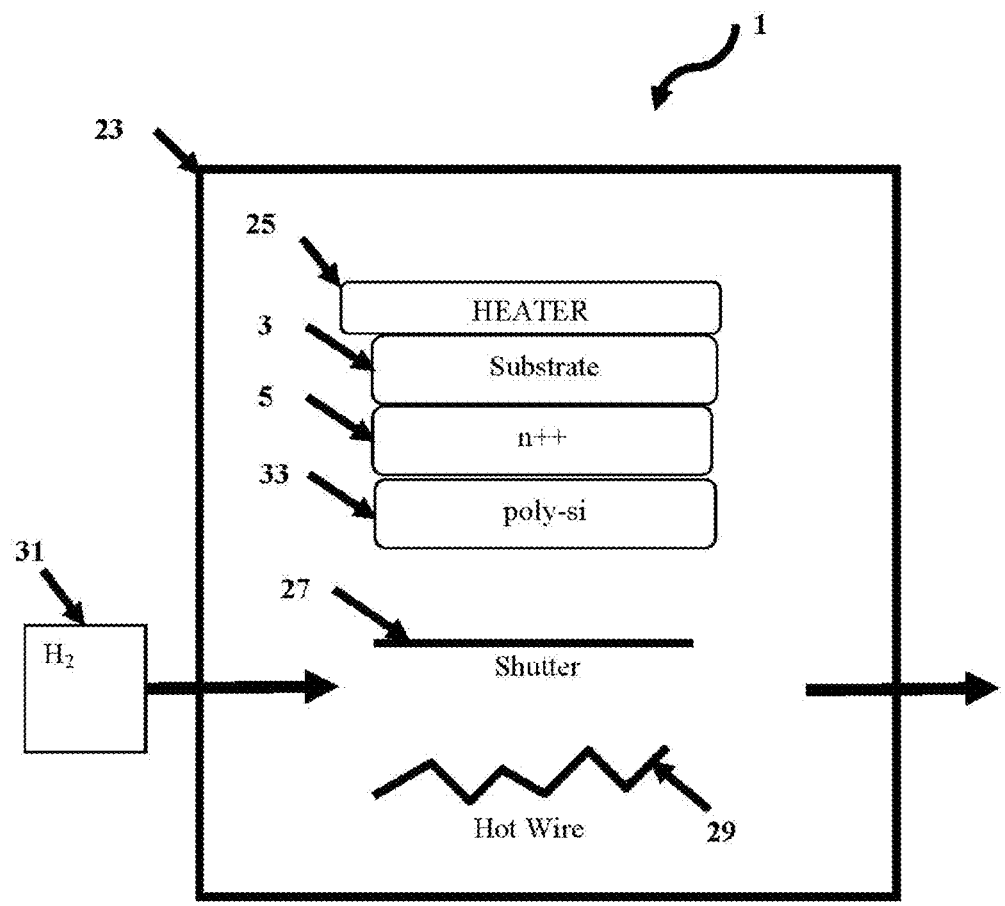
FIG. 3 depicts a preferred embodiment of a hotwire chemical vapor deposition chamber depicting a poly-si photovoltaic cell precursor.

FIG. 3 depicts a preferred embodiment of a hotwire chemical vapor deposition chamber depicting a poly-si photovoltaic cell precursor. The embodiment of a hotwire chemical vapor deposition chamber 21 in FIG. 3 comprises: a chamber 23, a heater 25, a shutter 27, a filament 29, and a hydrogen supply 31. In this embodiment, the poly-si to be hydrogenated 33 is combined with one or more layers (a substrate 3, an n-type semiconductor, preferably a heavily doped and highly conductive n-type semiconductor, layer 5, other layers, or combinations thereof). The substrate 3 is positioned in thermal contact, more preferably adjacent to, the heater 25. The shutter 27 is positioned between the filament 29 and the poly-si 7. The chamber 23, heater 25, shutter 27, filament 29, and hydrogen supply 31, the poly-si 33, substrate 3, and n-type semiconductor layer 5 are as described above.

FIG. 4

Figure 4:
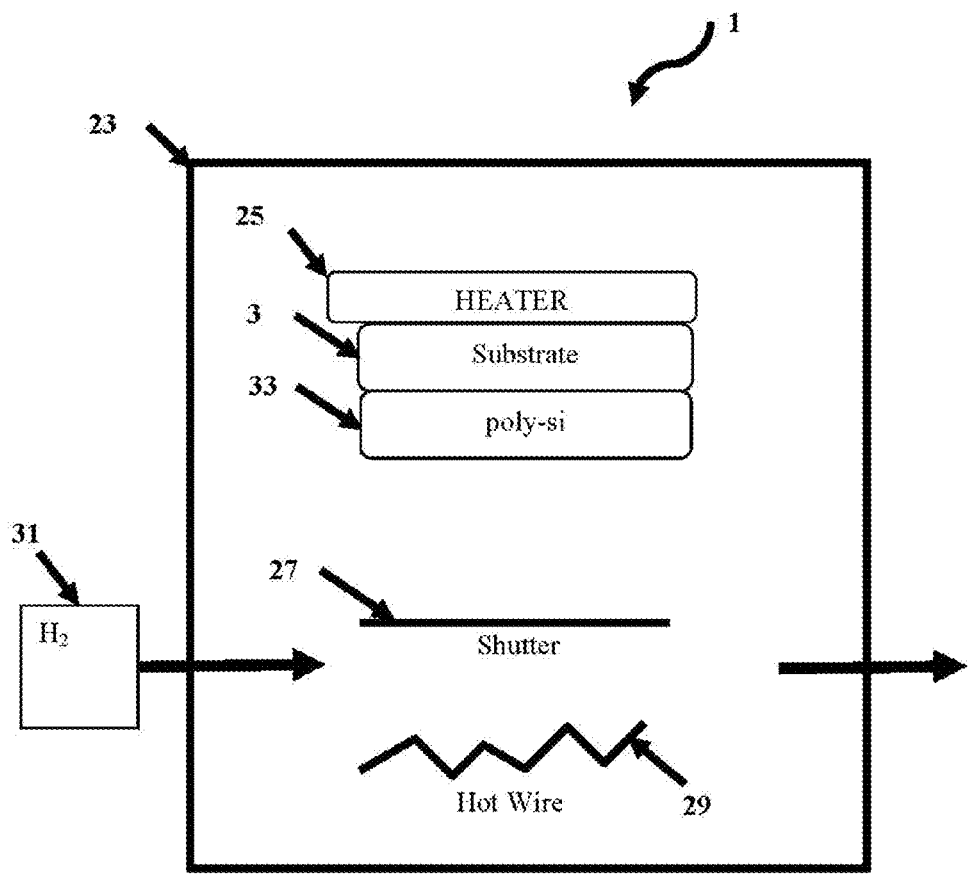
FIG. 4 depicts one embodiment of a hotwire chemical vapor deposition chamber depicting the hydrogenation of poly-si on a substrate.

FIG. 4 depicts one embodiment of a hotwire chemical vapor deposition chamber depicting the hydrogenation of poly-si on a substrate. The embodiment of a hotwire chemical vapor deposition chamber 21 in FIG. 4 comprises: a chamber 23, a heater 25, a shutter 27, a filament 29, and a hydrogen supply 31. In this embodiment, the poly-si to be hydrogenated 33 is juxtaposed to a substrate 3. The poly-si 33 is in thermal contact with the heater 25. Preferably, the substrate 3 is juxtaposed to the heater 25, as shown in FIG. 4. The shutter 27 is positioned between the filament 29 and the poly-si 7. The chamber 23, heater 25, shutter 27, filament 29, and hydrogen supply 31, the poly-si 33, and substrate 3 are as described above.

FIG. 5

Figure 5:
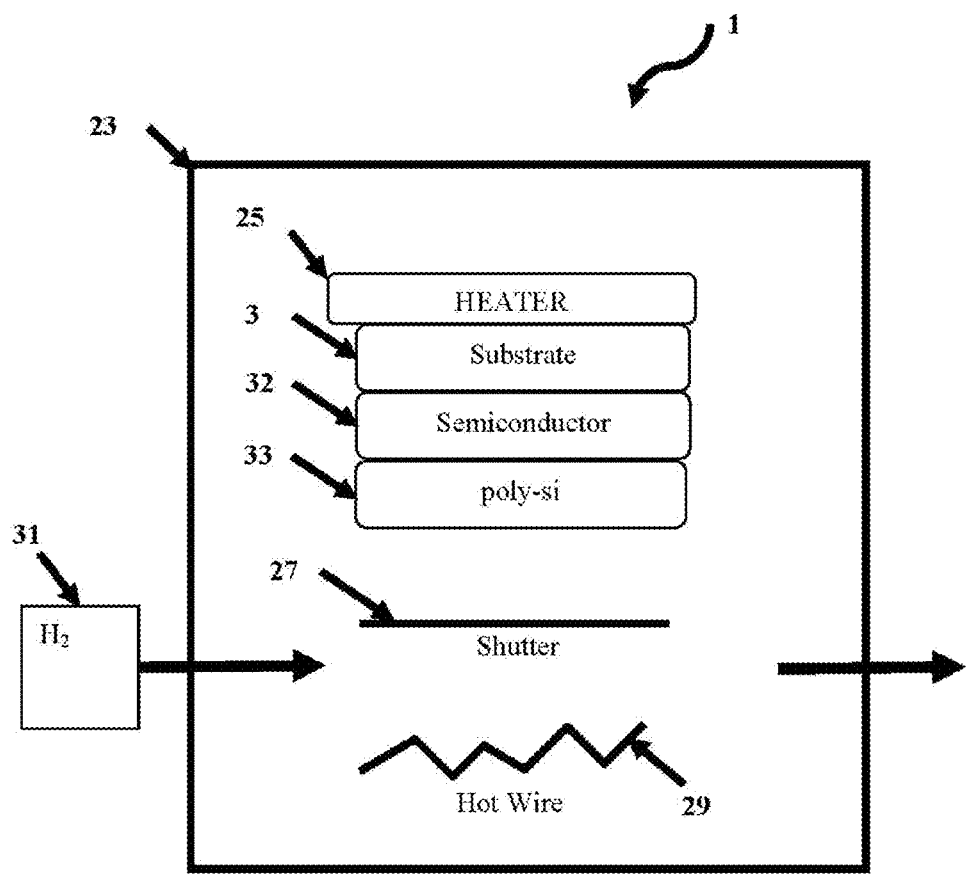
FIG. 5 depicts one embodiment of a hotwire chemical vapor deposition chamber depicting the hydrogenation of poly-si on a semiconductor.

FIG. 5 depicts one embodiment of a hotwire chemical vapor deposition chamber depicting the hydrogenation of poly-si on a semiconductor. The embodiment of a hotwire chemical vapor deposition chamber 21 in FIG. 5 comprises: a chamber 23, a heater 25, a shutter 27, a filament 29, and a hydrogen supply 31. In this embodiment, a semiconductor 32 is between and juxtaposed to a poly-si to hydrogenated 33 and a substrate 3. The poly-si 33 is in thermal contact with the heater 25. Preferably, the substrate 3 is juxtaposed to the heater 25, as shown in FIG. 5. The shutter 27 is positioned between the filament 29 and the poly-si 7. The chamber 23, heater 25, shutter 27, filament 29, and hydrogen supply 31, the poly-si 33, and substrate 3 are as described above. The semiconductor 3 is any semiconductor layer, preferably a doped layer, more preferably a p-type, n-type, or i-type semiconductor.

FIG. 6a

Figure 6A:
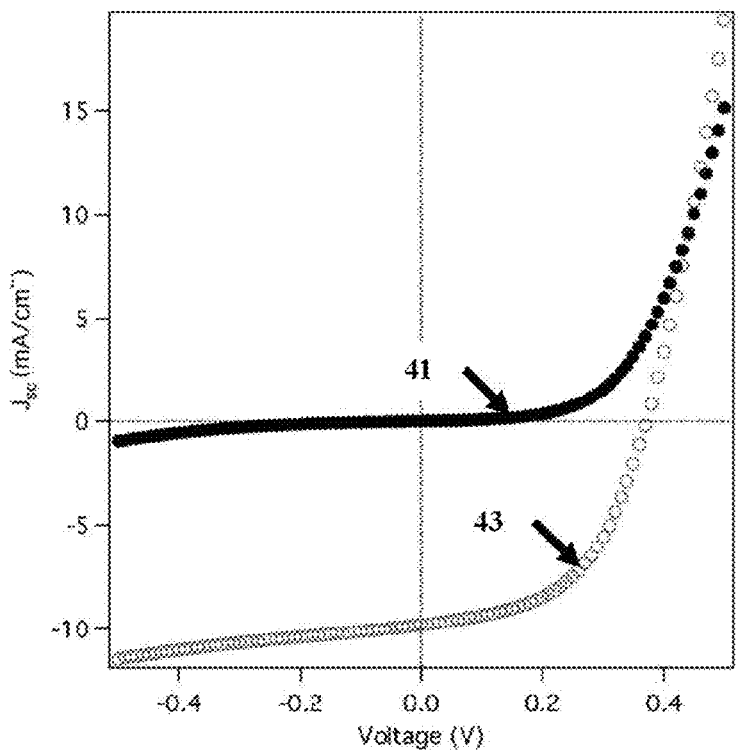
FIG. 6a depicts a voltage/current-density graph of a preferred embodiment of a preferred hydrogenated poly-si photovoltaic cell, as described in FIG. 1.

FIG. 6a depicts a voltage/current-density graph of a preferred embodiment of a preferred hydrogenated poly-si photovoltaic cell, as described in FIG. 1. As shown in FIG. 4, the first curve 41 depicts the current density when no light is present. The second curve 43 depicts the current density when exposed to AM 1.5 solar spectrum. As shown in FIG. 6a, the result is a poly-si photovoltaic cell having a $V_{OC}$ (Voltage Open Circuit) of 0.372V; FF (Fill Factor) 51%; $J_{SC}$ (Joules short circuit) 9.81 mA/cm$^2$; and an efficiency of 1.87%.

FIG. 6b

Figure 6B:
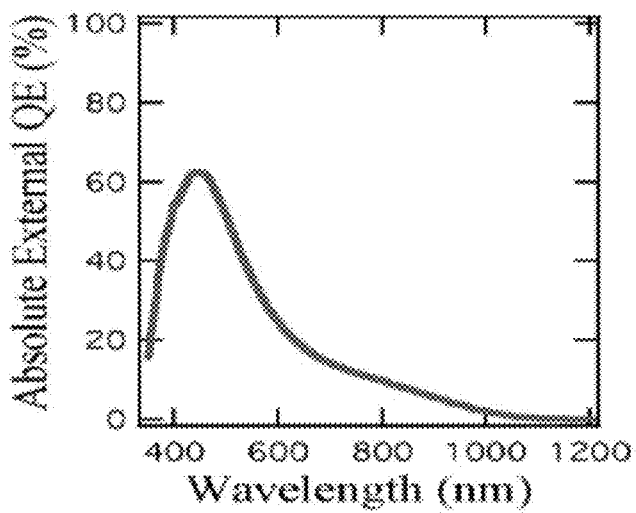
FIG. 6b depicts a quantum efficiency graph of a preferred embodiment of a hydrogenated poly-si photovoltaic cell, as described in FIG. 1.

FIG. 6b depicts a quantum efficiency graph of a preferred embodiment of a hydrogenated poly-si photovoltaic cell, as described in FIG. 1.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

The invention claimed is:

1. A method of hydrogenating poly-si comprising:
   providing poly-si and a filament;
   a. placing said poly-si into the interior of a chamber;
   b. placing said filament into the interior of said chamber;
   c. evacuating any gases from within the interior of said chamber;
   d. heating said poly-si for a predetermined poly-si heating time;
   e. heating a filament comprising providing an electrical power across said filament;
   f. supplying $H_2$ into said evacuated interior of said chamber comprising said heated poly-si and said heated filament, whereby said supplied $H_2$ reacts with said heated filament to produce atomic hydrogen; and g. said step of supplying $H_2$ comprises supplying $H_2$ to at a rate producing an atomic hydrogen surface density at the poly-si less than the poly-si surface density, thereby hydrogenating said poly-si.

2. The method of hydrogenating poly-si of claim 1 further comprising:
   a. covering said heated poly-si from H produced by said heated filament for a first predetermined covering time;
   b. uncovering said heated poly-si from H produced by said heated filament for a first predetermined hydrogenation time.

3. The method of hydrogenating poly-si of claim 2 further comprising:
   a. covering said heated poly-si from H produced by said heated filament for a second predetermined covering time after said step of uncovering said heated poly-si for a first predetermined hydrogenation time; and
   b. uncovering said heated poly-si from H produced by said heated filament for a second predetermined hydrogenation time.

4. The method of hydrogenating poly-si of claim 1 further comprising:
   a. said step of supplying $H_2$ comprises supplying $H_2$ to produce an atomic hydrogen surface density at said poly-si less than $6.77E14/cm^2$.

5. The method of hydrogenating poly-si of claim 1 further comprising:
   a. said step of supplying $H_2$ comprising:
      i. supplying $H_2$ at a pressure between 100-500 mTorr.

6. The method of hydrogenating poly-si of claim 1 further comprising:
   a. said step of evacuating the interior of said chamber comprising:
      i. evacuating the interior of said chamber to $10^{-6}$ Torr or less.

7. The method of hydrogenating poly-si of claim 1 further comprising:
   a. said step of heating said poly-si comprising:
      i. heating said poly-si to a temperature above 126.85° C.

8. The method of hydrogenating poly-si of claim 7 further comprising:
   a. said step of supplying $H_2$ comprising:
      i. supplying $H_2$ at a pressure between 100-500 mTorr; and
   b. said step of evacuating the interior of said chamber comprising:
      evacuating the interior of said chamber to $10^{-6}$ Torr or less.

9. The method of hydrogenating poly-si of claim 8 further comprising:
   a. covering said heated poly-si from H produced by said heated filament for a first predetermined covering time;
   b. uncovering said heated poly-si from H produced by said heated filament for a first predetermined hydrogenation time.

10. The method of hydrogenating poly-si of claim 9 further comprising:
    a. said filament comprising tungsten, tantalum, graphite or a combination thereof; and
    b. said step of heating a filament comprises providing an electrical power to said filament to heat said filament to a temperature between 1,500 and 2,300° C.

11. The method of hydrogenating poly-si of claim 10 further comprising:
    a. said step of providing an electrical power to said provided filament to heat said tungsten filament to a temperature between 1,500 and 2,300° C. comprising:
       i. providing an electrical current between, and including, 6 and 18 Amps through said filament.

12. The method of hydrogenating poly-si of claim 1 further comprising:
    a. said step of heating said poly-si comprising:
       i. heating said poly-si to a temperature between, and including, 300 and 600° C.

13. The method of hydrogenating poly-si of claim 1 further comprising:
    a. said first predetermined hydrogenation time comprises 30 minutes.

14. The method of hydrogenating poly-si of claim 1 further comprising:
    a. said step of heating said filament to produce H comprising:
       i. heating said filament to a temperature less than 2,300° C.

15. The method of hydrogenating poly-si of claim 1 further comprising:
    a. cooling said heated poly-si in $H_2$.

16. The method of hydrogenating poly-si of claim 1 further comprising:
    a. said filament comprising tungsten, tantalum, graphite or a combination thereof.

17. The method of hydrogenating poly-si of claim 1 further comprising:
    a. said filament comprising tungsten, tantalum, graphite or a combination thereof; and
    b. said step of heating a filament comprises providing an electrical power to said filament to heat said filament to a temperature between 1,500 and 2,300° C.

18. The method of hydrogenating poly-si of claim 17 further comprising:
    a. said step of providing an electrical power to said provided filament to heat said tungsten filament to a temperature between 1,500 and 2,300° C. comprising:
       i. providing an electrical current between, and including, 6 and 18 Amps through said filament.

19. The method of hydrogenating poly-si of claim 1 further comprising:
    a. providing a substrate; and
    b. said poly-si juxtapose to said substrate.

20. The method of hydrogenating poly-si of claim 1 further comprising:
    a. providing a substrate and a semiconductor; and
    b. said semiconductor positioned between and juxtapose to said substrate and said poly-si.

21. The method of hydrogenating poly-si of claim 1 further comprising:
    a. said hydrogenated poly-si forming a layer of a photovoltaic device comprising a substrate, an n-type semiconductor, a heterojunction, a transparent electrode and said poly-si; said heterojunction, said poly-si and said n-type semiconductor positioned between said transparent electrode and said substrate.

* * * * *